US006388377B1

United States Patent
Kobayashi et al.

(10) Patent No.: US 6,388,377 B1
(45) Date of Patent: May 14, 2002

(54) ELECTROLUMINESCENT ELEMENT WITH BANKS INTERSECTING ANODE GROUP

(75) Inventors: Hidekazu Kobayashi, Nagano-ken; Hiroshi Kiguchi, Suwa; Tatsuya Shimoda, Nagano-ken, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/297,482

(22) PCT Filed: Aug. 19, 1998

(86) PCT No.: PCT/JP98/03676

§ 371 Date: Apr. 30, 1999

§ 102(e) Date: Apr. 30, 1999

(87) PCT Pub. No.: WO99/12397

PCT Pub. Date: Mar. 11, 1999

(30) Foreign Application Priority Data

Sep. 1, 1997 (JP) .............................. 9-236328

(51) Int. Cl.⁷ .............................. H01J 1/62; H01J 63/04
(52) U.S. Cl. ........................ 313/505; 313/506; 313/509; 445/24; 427/66
(58) Field of Search ................................. 313/505, 506, 313/509, 502, 503, 500, 498; 428/690; 445/24; 427/66

(56) References Cited

U.S. PATENT DOCUMENTS

| | | | | |
|---|---|---|---|---|
| 4,143,297 A | * | 3/1979 | Fischer | 313/502 |
| 5,239,227 A | * | 8/1993 | Kikinis | 313/506 |
| 5,294,869 A | * | 3/1994 | Tang et al. | 313/504 |
| 5,701,055 A | * | 12/1997 | Nagayama et al. | 313/504 |
| 6,013,982 A | * | 1/2000 | Thompson et al. | 313/506 |

FOREIGN PATENT DOCUMENTS

JP 9283280 10/1997 ............ H05B/33/10

* cited by examiner

*Primary Examiner*—Vip Patel
*Assistant Examiner*—Kevin Quarterman
(74) *Attorney, Agent, or Firm*—Hogan & Hartson, L.L.P.

(57) ABSTRACT

In order to provide a bright, color, simple matrix-type electroluminescent element which can be manufactured by means of a simple process, banks 4 required for fabricating organic films head in an electroluminescent element by means of an ink-jet are formed such that they intersect orthogonally with anodes 6, and patterning of cathodes 1 is carried out using these banks. By means of this composition, cathode patterning becomes possible without increasing the number of processes. Therefore, it becomes possible to manufacture a full-color simple matrix-type electroluminescent element, inexpensively.

15 Claims, 5 Drawing Sheets

- 1 CATHODE
- 2 LIGHT-EMITTING LAYER
- 3 PROTECTIVE LAYER
- 4 BANK
- 5 HOLE INJECTING AND TRANSPORTING LAYER
- 6 ANODE
- 7 TRANSPARENT SUBSTRATE

FIG.5

VAPOUR DEPOSITION OF CATHODES

OR

- 1 CATHODE (PERPENDICULAR TO SURFACE OF PAPER)
- 6 ANODE (HORIZONTAL TO SURFACE OF PAPER)

FIG.6

- 1 CATHODE
- 2 LIGHT-EMITTING LAYER
- 3 PROTECTIVE LAYER
- 4 BANK
- 5 HOLE INJECTING AND TRANSPORTING LAYER
- 6 ANODE
- 7 TRANSPARENT SUBSTRATE

ELECTROLUMINESCENT ELEMENT WITH BANKS INTERSECTING ANODE GROUP

TECHNICAL FIELD

The present invention relates to a structure and a composition for an electroluminescent element which can be used in a lap-top computer, television, mobile communications display, or the like, for example.

BACKGROUND ART

Electroluminescent elements which make use of the electroluminescence of an organic compound have features such as high visibility due to their self-luminescence, excellent shock resistance properties due to their complete solid state structure, and low drive voltage requirements, etc., and therefore they have received attention for use as luminescent elements in display devices of various types. In order to broaden the use of the aforementioned organic EL (electroluminescent) elements, it is evident that multicolour display capacity is required, as seen in cathode ray tubes (CRT), liquid crystal displays (LCD), and the like.

Conventionally known methods for fabricating a multicolour display device using EL elements include, for example: (1) a method whereby EL materials which emit light in the three primary colours of red (R), green (G) and blue (B) are arranged in a matrix configuration (Japanese Patent Laid-open No. 1577487/1982, Japanese Patent Laid-open No. 147989/1983, Japanese Patent Laid-open No. 214593/1991, and the like); (2) a method whereby the three primary colours, R, G, B, are extracted by combining colour filters with an EL element emitting white light (Japanese Patent Laid-open No. 315988/1989, Japanese Patent Laid-open No. 273496/1990, Japanese Patent Laid-open No. 194895/1991, and the like); (3) a method whereby an EL element emitting red light and a fluorescence converting film are used to convert to the three primary colours, R, G, B (Japanese Patent Laid-open No. 3-152897). However, the methods (2) and (3) described above both have a similar structure to the colour filter used in a colour liquid crystal display device, and consequently they require approximately the same level of expenditure. Moreover, in the method described in (1) above, three different types of luminescence material must be arranged in a very fine matrix configuration.

Therefore, as disclosed in Japanese Patent Laid-open No. 227276/1996, in the method in (1), the luminescent materials for the respective colours are formed over a physical mask in order to fabricate the light-emitting layers for the different colours. Moreover, in U.S. Pat. No. 5,294,869, high walls and low walls are provided between pixels, light-emitting layers are fabricated separately for each colour according to the height of the walls and the vapour deposition angle of electroluminescent material, and furthermore, electrodes are formed by patterning using the aforementioned walls.

However, in methods using a physical mask, not only does the positional registration of the physical mask involve enormous work, but also it is technologically difficult to fabricate a suitable physical mask when manufacturing panels of very high definition, and even supposing that such a mask can be fabricated, it is difficult to carry out accurate patterning of the light-emitting layers. Therefore, it is not practicable to manufacture a high-definition colour panel using physical masks. Moreover, in methods which involve creating walls between pixels, it is necessary to build in the high walls and low walls, and furthermore, a plurality of light-emitting layers must be formed by a plurality of vapour deposition operations whilst varying the vapour deposition angle in the vacuum system.

The present invention overcomes these problems associated with the prior art. A first object of the present invention is to provide an inexpensive electroluminescent element having a novel composition enabling colour display, by providing banks capable of separating light-emitting layers in a passive-drive electroluminescent element.

A second object of the present invention is to provide a manufacture method whereby an electroluminescent element having a novel composition enabling colour display can be manufactured inexpensively, by comprising steps of forming banks in a passive-drive electroluminescent element and introducing light-emitting material therebetween.

DISCLOSURE OF THE INVENTION

The invention achieving the first object is an electroluminescent element provided with layers of electroluminescent material interposed between anodes and cathodes, characterized in that it comprises: an anode group formed by parallel arrangement of a plurality of anodes; a bank group formed by parallel arrangement of banks intersecting with the anode group and having a height which prevents outflow of the electroluminescent material introduced during manufacture; electroluminescent material layers formed inbetween the banks; and a cathode group wherein cathodes running in the longitudinal direction of the electroluminescent material layers are provided on the electroluminescent material layers and are separated electrically for each of the electroluminescent material layers by means of the banks. By adopting a structure which is partitioned by banks, the electroluminescent material layers can be manufactured readily by introducing a liquid of electroluminescent material, and cathode formation can also be carried out in a single operation.

Here, the cathodes are formed in a continuous fashion over a side face of the banks facing in a prescribed direction, the top face of the banks, and the electroluminescent material layers. By adopting this structure, patterning of the cathodes is carried out simultaneously with vapour deposition of the cathodes by making use of the shadow of the banks. Therefore, it is possible to carry out patterning of cathodes formed on organic films which are delicate with respect to processing.

Moreover, the angle formed between at least one side face of the banks and the face on which the banks are installed is an acute angle. By adopting this structure, the cathodes can be formed separately by depositing cathode material from a single direction, and the reliability of patterning can be improved. Moreover, a uniform distance can be maintained between the banks. Thereby, it becomes easier to hit desired pixels when a liquid of electroluminescent material is injected by means of an ink-jet head, for example.

Furthermore, the angle formed between at least one side face of the banks and top face thereof is an acute angle. By adopting this structure, since regions where no cathode material is deposited are generated by the shadow of the banks, the separation of the cathodes is carried out automatically and reliably, and the reliability of patterning can be increased.

Furthermore, the electroluminescent material layers are constituted by light-emitting layers and/or charge transporting layers. The charge transporting layers may be hole injecting and transporting layers or electron injecting and transporting layers. Here, the light-emitting layers emitting light in each of the primary colours for the purpose of providing a colour display are arranged sequentially.

Moreover, in the present invention, each of the anodes constituting the anode group and each of the cathodes constituting the cathode group are connected individually, means being provided for conducting simple matrix driving of the electroluminescent element. By means of this structure, it becomes possible to drive the electroluminescent element by time division, thereby providing an inexpensive, high-capacity, colour electroluminescent element.

The invention for achieving the second object is a method for manufacturing an electroluminescent element provided with layers of electroluminescent material interposed between anodes and cathodes, characterized in that it comprises the steps of: forming an anode group by parallel arrangement of a plurality of anodes on a substrate; forming a bank group by parallel arrangement of banks intersecting with the anode group and having a height which prevents outflow of the electroluminescent material in an electroluminescent material forming step; forming electroluminescent material layers by introducing a liquid of the electroluminescent material inbetween the banks; and forming a cathode group wherein cathodes are electrically separated by means of the banks, by depositing cathode material onto the electroluminescent material layers from a direction which forms a prescribed angle with the longitudinal direction of the banks. By means of these steps, it is possible to form the electroluminescent material layers at normal pressure whilst separating them by means of the banks, without requiring vacuum batch processing involving vapour deposition, or the like.

Moreover, the cathodes can be patterned very finely into thin rectangular shapes for the purpose of simple matrix driving. Here, the banks may be formed such that the angle between the side faces thereof and the face on which the banks are installed is a right angle, the cathode group being formed by depositing cathode material by oblique vapour deposition from a direction confronting the side faces, or a direction perpendicular to the vertical direction of the banks. By this means, cathode patterning is completed simultaneously with cathode vapour deposition, making use of the shadow of the banks. Therefore, it is possible to carry out patterning of cathodes formed on organic films which are delicate with respect to processing.

Moreover, the banks may be formed such that the angle between at least one side face of the banks and the face on which the banks are installed is an acute angle, the cathode group being formed by depositing cathode material by oblique vapour deposition from a direction confronting the one side face or the vertical direction of the banks. Thereby, the reliability of cathode patterning can be increased and the distance between banks can be kept the same as cases where the banks have a rectangular shape, and therefore it becomes easier to hit desired pixels when film material is injected by means of an ink-jet head, or the like.

Moreover, the banks may be formed such that the angle between at least one side face of the banks and the top face thereof is an acute angle, the cathode group being formed by vapour deposition from the vertical direction of the banks. By this means, it is possible to increase the reliability of cathode patterning. Furthermore, non-glare treatment and/or antireflection treatment may be carried out on the surface of the electroluminescent element. By this means, it is possible to improve contrast in the electroluminescent element when used in bright locations.

BEST MODE FOR CARRYING OUT THE INVENTION

(First Embodiment)

The present embodiment is a passive-drive electroluminescent element provided with layers of electroluminescent material interposed between anodes and cathodes, characterized in that it comprises: an anode group formed by parallel arrangement of a plurality of anodes; a bank group formed by parallel arrangement of banks intersecting with the anode group and having a height which prevents outflow of the electroluminescent material introduced during manufacture; electroluminescent material layers formed inbetween the banks; and a cathode group wherein cathodes running in the longitudinal direction of the electroluminescent material layers are provided on each of the electroluminescent material layers and are separated electrically by means of the banks. By means of the structure partitioned by banks, the electroluminescent material layers can be manufactured readily by filling in a liquid of electroluminescent material, and cathode formation can also be carried out in a single operation.

Figure 1:
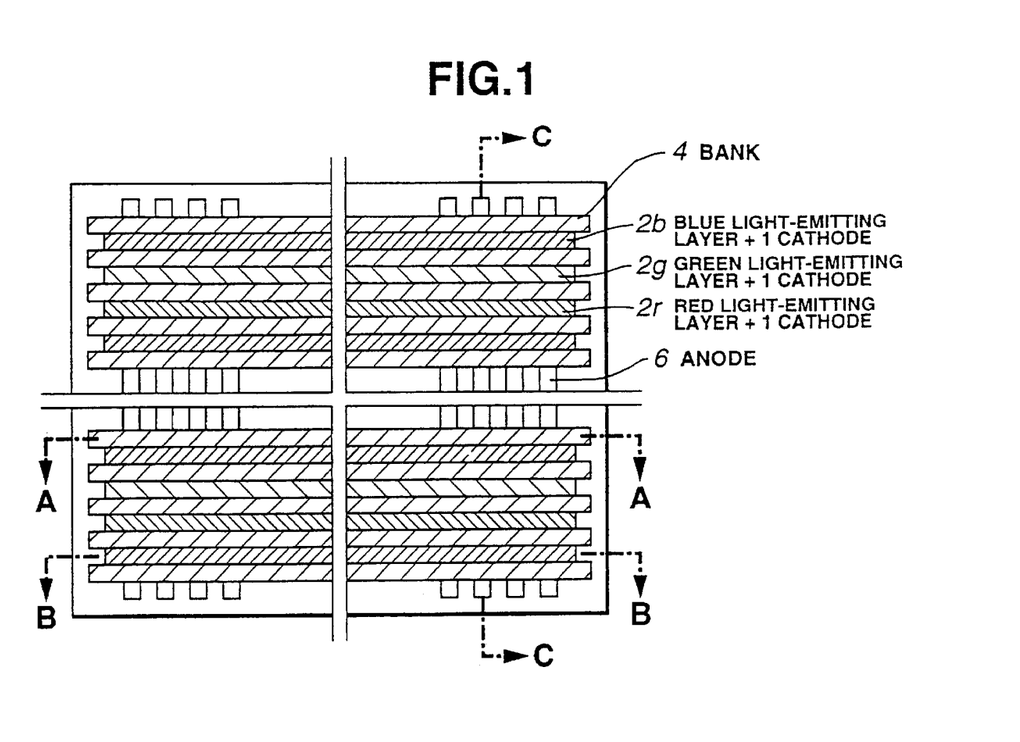
FIG. 1 is a plan view of an electroluminescent element in a first embodiment of the present invention.
Figure 2:
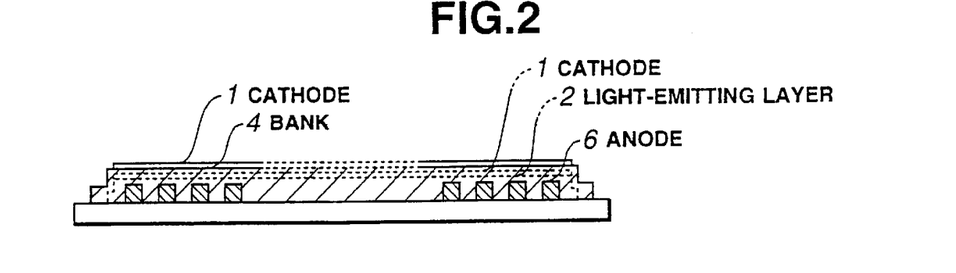
FIG. 2 is a sectional view along A—A of the electroluminescent element in FIG. 1.
Figure 3:
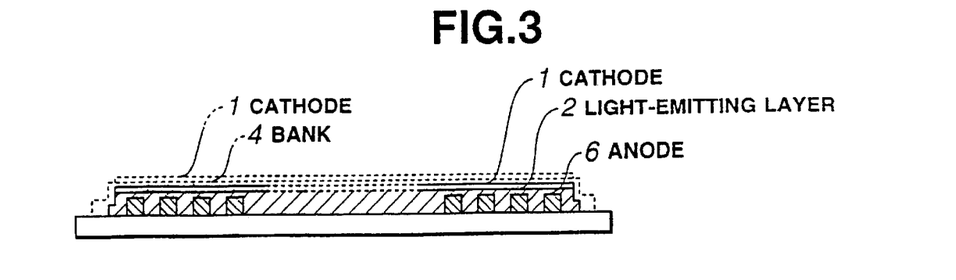
FIG. 3 is a sectional view along B—B of the electroluminescent element in FIG. 1.
Figure 4:
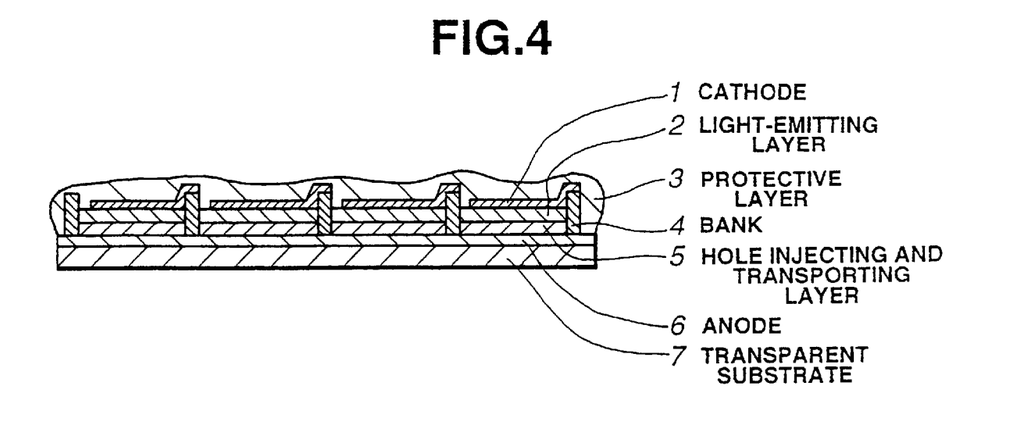
FIG. 4 is a sectional view of an electroluminescent element according to a first embodiment of the present invention, in a plane perpendicular to the longitudinal direction of the banks (sectional view along C—C of the electroluminescent element in FIG. 1).

FIG. 1 is a plan view illustrating the structure of an electroluminescent element according to the first embodiment; FIG. 2 is a sectional view along A—A in FIG. 1; FIG. 3 is a sectional view along B—B in FIG. 1; and FIG. 4 is a sectional view along C—C in FIG. 1. As these drawings show, the electroluminescent element according to the present embodiment comprises: an anode group formed by arranging a plurality of anodes 6 in parallel on a transparent substrate 7; a bank group formed by arranging in parallel a plurality of banks 4 intersecting with the anode group and having a height which prevents outflow of electroluminescent material introduced during manufacture; a hole injecting and transporting layer 5 and light-emitting layers 2 constituted by electroluminescent material layers formed between the banks 4; a cathode group wherein cathodes 1 running in the longitudinal direction of the electroluminescent material layers are provided on each of the electroluminescent material layers and are separated electrically by means of the banks 4; and a protective layer 3. A characteristic feature of the cathodes 1 is that, according to their fabrication method, they are formed in a continuous fashion on one side face of the banks 4 facing in a uniform direction, the top face of the banks, and the electroluminescent material layers. The longitudinal direction of the anodes 6 should intersect with, but not necessarily in a perpendicular fashion, the longitudinal direction of the banks 4, hole injecting and transporting layers 5, light-emitting layers 2, cathodes 1, and the like. The electroluminescent material layers may comprise a hole injecting and transporting layer for raising the transportation function of holes, a light-emitting layer for generating fluorescent light by application of an electric field, and an electron injecting and transporting layer for raising the transportation function of electron holes.

Figure 5:
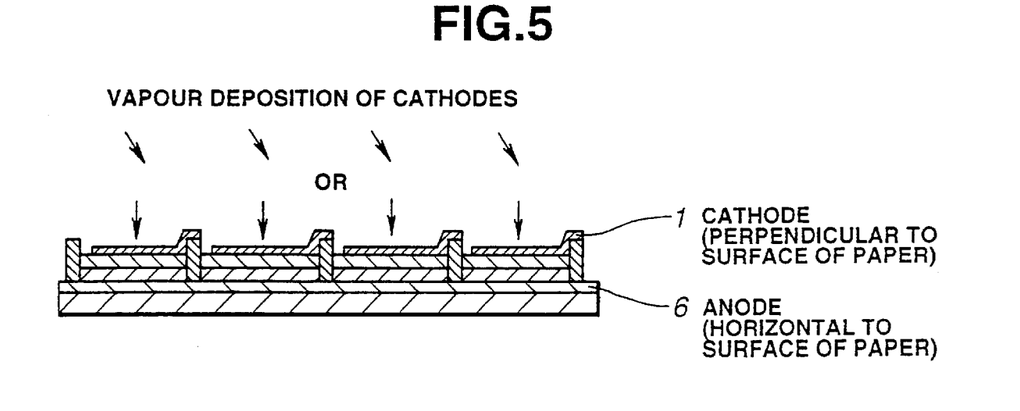
FIG. 5 is a sectional view of an electroluminescent element according to a first embodiment of the present invention, in a plane perpendicular to the longitudinal direction of the banks, illustrating a manufacturing process for same.

Next, a method for manufacturing an electroluminescent element having the aforementioned structure is described. Firstly, Indium Tin Oxide (ITO) was deposited onto a clean glass substrate (transparent substrate 7) by EB vapour deposition to form a transparent electrode, whereupon electrodes 6 were fabricated by patterning this electrode in thin rectangular shapes. Moreover, as shown in FIG. 4, a photosensitive resist and a contrast enhancing layer were applied and pattern exposure was carried out to fabricate longitudinal banks 4. In this process, the banks were formed to a height exceeding the total thickness of the electroluminescent material layers formed subsequently, as illustrated in FIG. 4. This height is adjusted such that a liquid of electroluminescent material will not spill over the banks when it is introduced. In this case, the height of the banks was set to 2 $\mu$m. As shown in FIG. 5, the banks 4 were formed such that the longitudinal direction thereof intersected with the longitudinal direction of the aforementioned anodes 6. Thereupon, using an ink-jet head, a hole injection material in the form of a 1:1 mixture of copper phthalocyanine and epoxypropyl triethoxysilane in an ethoxyethanol dispersed solution was injected inbetween the banks, and calcinated for 5 minutes at 200° C. to form hole injecting and transporting layers 5 of 10 nm film thickness. In the group of green-coloured pixels, an aqueous solution of a water-soluble precursor of PPV-G (chemical formula 1) was applied thereto by means of an ink-jet head and then calcinated for 4 hours at 150° C. to form green light-emitting layers 2 g of 100 nm film thickness. In the group of blue-coloured pixels, an aqueous solution of a water-soluble precursor of PPV-B (chemical formula 2) was applied by means of an ink-jet head and then calcinated for 4 hours at 150° C. to form blue light-emitting layers 2b of 100 nm film thickness. In the group of red-coloured pixels, an aqueous solution of a water-soluble precursor of PPV-R (chemical formula 3) was applied by means of an ink-jet head and then calcinated for 4 hours at 150° C. to form red light-emitting layers 2r of 100 nm film thickness.

(Chemical formula 1)

(Chemical formula 2)

(Chemical formula 3)

As shown in FIG. 5, the cathodes 1 were fabricated by EB vapour deposition of an alloy of Mg:Ag (10:1) forming the cathode material in a direction inclined by 45° with respect to the face on which the banks are installed, in other words, the normal to the panel. Since the cathodes were vapour deposited from a direction confronting the side faces of the banks, regions affected by the banks were generated, and consequently, the cathodes were electrically separated for each pixel without needing to carry out a special patterning operation. Moreover, a protective layer 3 was formed by moulding an epoxy resin. As the protective layer, besides epoxy resin, it is possible to use a thermosetting resin, ultraviolet-setting resin, silicon resin containing polysilazane, or the like, provided that the resin is capable of shutting out air and moisture, and it does not interfere with the organic film. Furthermore, the cathodes 1 may be subjected to patterning, if vapour deposition is carried out in the direction of the normal to the panel.

Here, copper phthalocyanine was used as the hole injecting material forming the electroluminescent material in the hole injecting and transporting layer 5, but materials such as porfine compounds, TPD (chemical formula 4), m-MTDATA (chemical formula 5), NPD (chemical formula 6), polyvinyl carbazole, TAD (chemical formula 7), polyaniline, carbon, or the like, may be used similarly, provided that they have a hole injecting function. Combinations or laminated structures of these compounds may also be used.

(Chemical formula 4) TPD (Chemical formula 5) m-MTDATA (Chemical formula 6) NPD (Chemical formula 7) TAD (Chemical formula 8) DPVBi (Chemical formula 9) DCM1

(Chemical formula 10) DCJT

For the light-emitting layers 2, in addition to the foregoing description, it is also possible to use PPV or derivatives thereof, complexes based on metal quinolinol derivatives or azomethine derivatives, DPVBi (chemical formula 8), tetraphenyl butadiene, oxadiazol derivatives, polyvinyl carbazole derivatives, or the like, and furthermore, it is also possible to add to these compounds, materials, such as perylene, cumarine derivatives, DCM1 (chemical formula 9), quinacridone, rubrene, DCJT (chemical formula 10), Nile red, or the like. Moreover, fluorescence converting materials may be combined or laminated. (Chemical formula 8) DPVBi (Second Embodiment)

In this embodiment, an example is illustrated wherein the banks are formed such that the angle formed between at least one side face thereof and the face on which the banks are installed is an acute angle.

Figure 6:
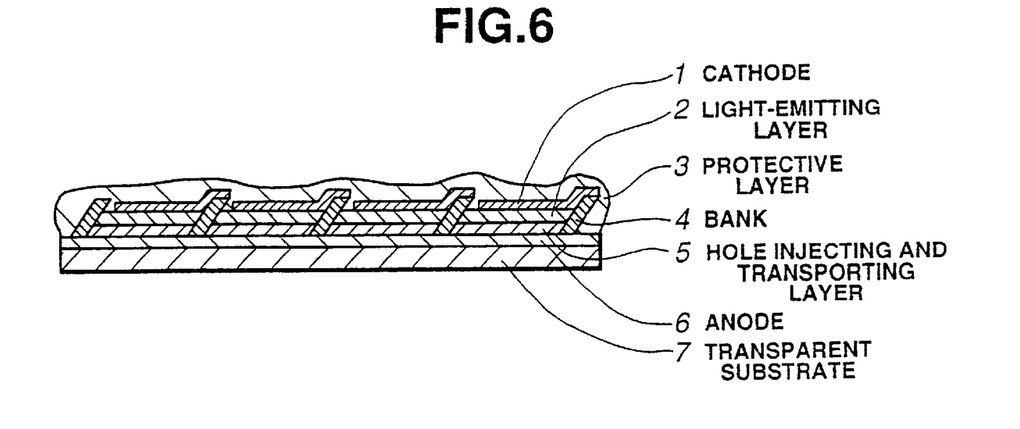
FIG. 6 is a sectional view of an electroluminescent element according to a second embodiment of the present invention, in a plane perpendicular to the longitudinal direction of the banks.

FIG. 6 gives a sectional view of an electroluminescent element according to the present embodiment along a plane perpendicular to the longitudinal direction of the banks. The electroluminescent element according to the present embodiment comprises: a transparent substrate 7, anodes 6, hole injecting and transporting layers 5, banks 4, a protective layer 3, light-emitting layers 2, and cathodes 1. With the exception of the shape of the banks, this embodiment is the same as the first embodiment described above, and therefore description thereof is omitted. The present embodiment is characterized in that the banks 4 are fabricated such that the angle formed between one side face thereof and the face on which the banks are installed is an acute angle.

Figure 7:
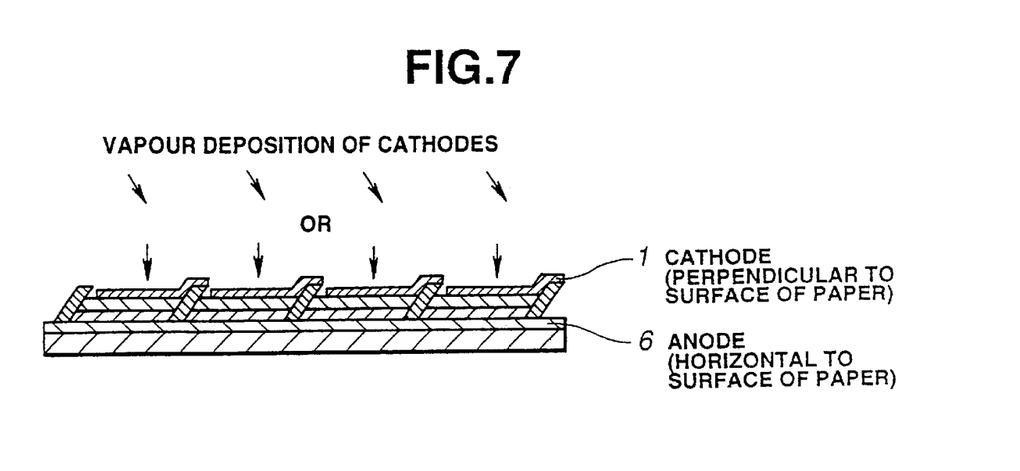
FIG. 7 is a sectional view of an electroluminescent element according to a second embodiment of the present invention, in a plane perpendicular to the longitudinal direction of the banks, illustrating a manufacturing process for same.

Next, a method for manufacturing an electroluminescent element according to this embodiment is described. The processing steps prior to formation of the banks are similar to the first embodiment. In the bank fabrication process, firstly, a resist layer consisting of bank material was formed to a thickness of 2 $\mu$m, and was then exposed to light through a photo mask at an angle of 45° with respect to the normal to the panel. Thereupon, etching was performed to fabricate banks 4 having a parallelogram-shaped cross-section. The subsequent ink-jet process was similar to that in the first embodiment. After forming the light-emitting layers 2, cathodes 1 were fabricated by EB vapour deposition of an Mg:Ag (10:1) alloy as the cathode material from the direction of the normal to the panel. The processing from this stage onwards was similar to that in the first embodiment.

According to this embodiment, since a side face of each bank forms an obtuse angle with the installation face of the banks, it is possible to form separated cathodes by depositing a cathode material from a single direction, and it is possible to increase the reliability of patterning. Moreover, it is possible to maintain a uniform distance between banks. When injecting electroluminescent material by means of an ink-jet head, for example, it becomes easier to hit the desired pixel.

(Third Embodiment)

In this embodiment, an example is illustrated wherein the cross-sectional shape of the aforementioned bank is an inverted platform shape, and the aforementioned cathode material is vapour deposited from a perpendicular direction with respect to the side face of the panel.

Figure 8:
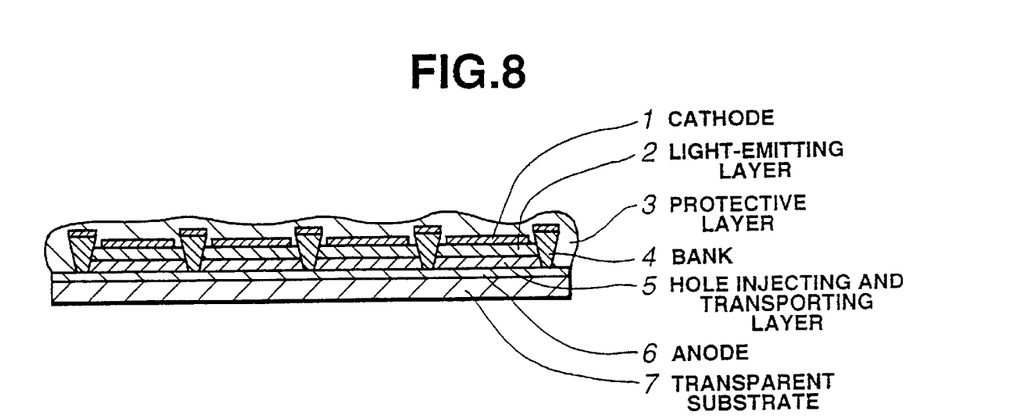
FIG. 8 is a sectional view of an electroluminescent element according to a third embodiment of the present invention, in a plane perpendicular to the longitudinal direction of the banks.

FIG. 8 is a sectional view of an electroluminescent element according to the present embodiment, cut in a plane which is perpendicular to the longitudinal direction of the banks. The electroluminescent element according to the present embodiment comprises: a transparent substrate 7, anodes 6, hole injecting and transporting layers 5, banks 4, a protective layer 3, light-emitting layers 2 and cathodes 1. With the exception of the shape of the banks 4, this embodiment is similar to the first embodiment, and description thereof is omitted here. The present embodiment is characterized by the fact that the banks 4 are fabricated such that the angle formed between at least one side face of the banks 4 and the top face thereof is an acute angle.

Figure 9:
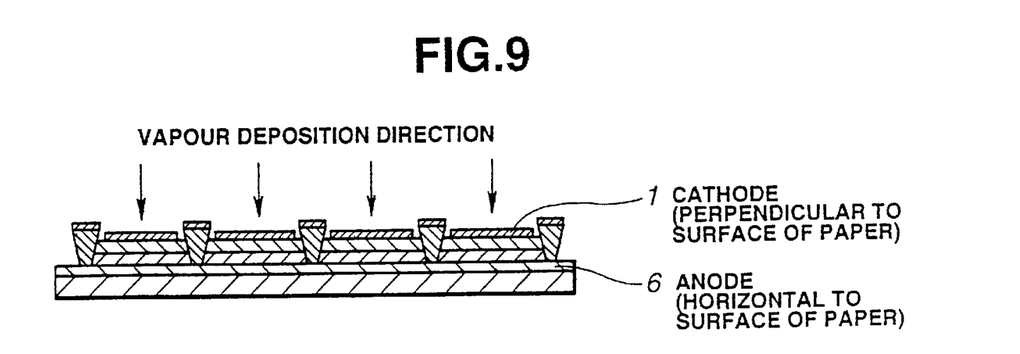
FIG. 9 is a sectional view of an electroluminescent element according to a third embodiment of the present invention, in a plane perpendicular to the longitudinal direction of the banks, illustrating a manufacturing process for same.

Next, a method for manufacturing the electroluminescent element according to the present embodiment is described. The processing steps prior to formation of the banks are similar to the first embodiment. In the bank fabrication process, firstly, a resist layer consisting of bank material was formed to a thickness of 2 μm, and furthermore, a contrast enhancing layer was formed. Light exposure was then carried out through a photo mask at an angle of 45° with respect to the normal to the panel. Thereupon, over-etching was performed to fabricate banks 4 having an inverted platform-shaped cross-section. Subsequent ink-jet processing was similar to that in the first embodiment. After forming the light-emitting layers 2, cathodes 1 were fabricated by EB vapour deposition of an Mg:Ag (10:1) alloy as the cathode material from the direction of the normal to the panel. The processing from this stage onwards was similar to that in the first embodiment.

According to this embodiment, since regions where no cathode material is deposited are formed under the shelter of the banks, separation of the cathodes is achieved automatically, and the reliability of patterning can be increased.

(Fourth Embodiment)

This embodiment illustrates an example where non-glare treatment and/or antireflection treatment is carried out on the surface of the electroluminescent element. When an AG-20 non-glare film manufactured by Hitachi Denko Co. Ltd. was applied to the front surface of the panel, reflection of ambient light was reduced and contrast was improved. Furthermore, when antireflection treatment was applied to the surface of the AG-20 film, there was virtually no reflection of ambient light and contrast was improved remarkably.

The non-glare film to be used is not limited to the types shown here, and any type of non-glare film having a similar effect may be used. Moreover, in this case, "Saitop" manufactured by Asahi Glass Co. Ltd. was used for the antireflection treatment, but besides this, it is also possible to use a multilayer coating or low-diffraction-index material coating, or the like.

(Fifth Embodiment)

Figure 10:
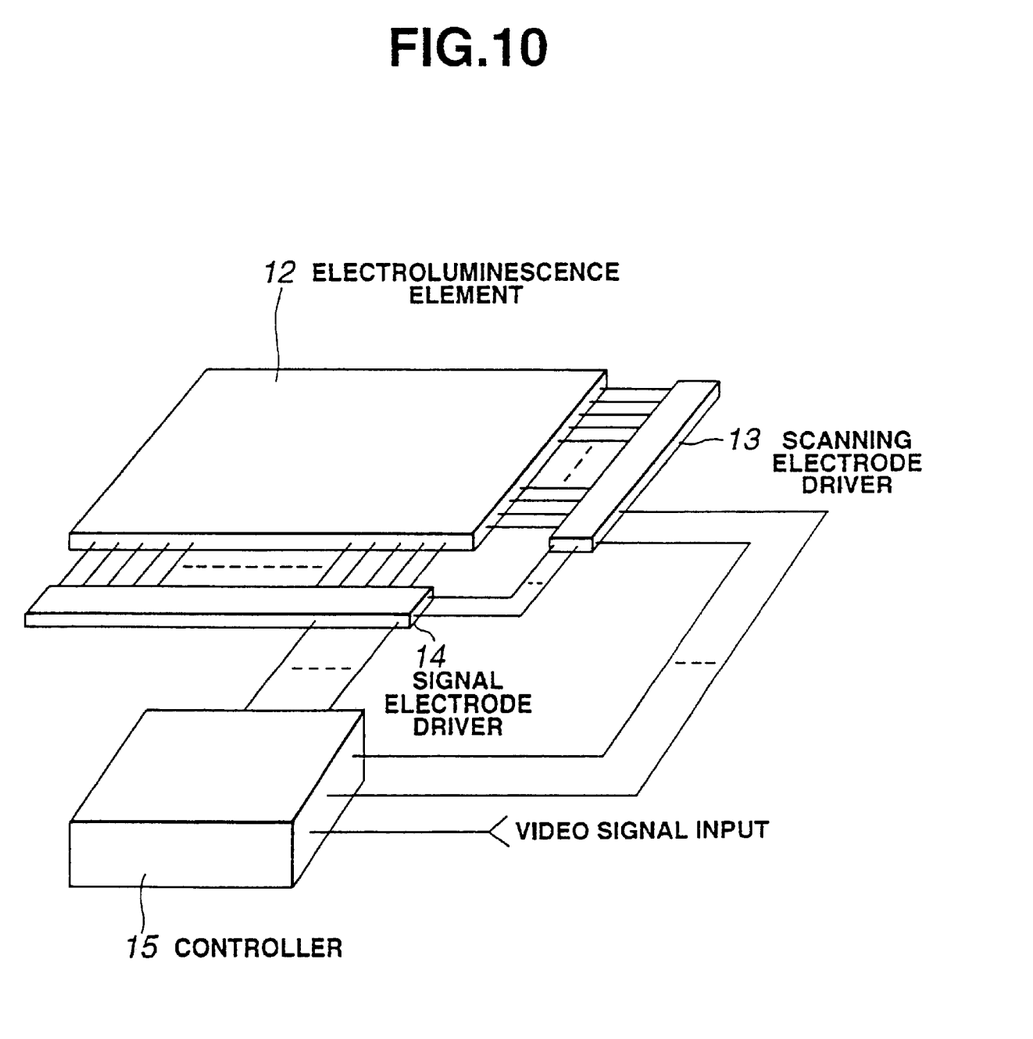
FIG. 10 is a simple connection diagram showing an electroluminescent element and driving means according to a fifth embodiment of the present invention.
Figure 11:
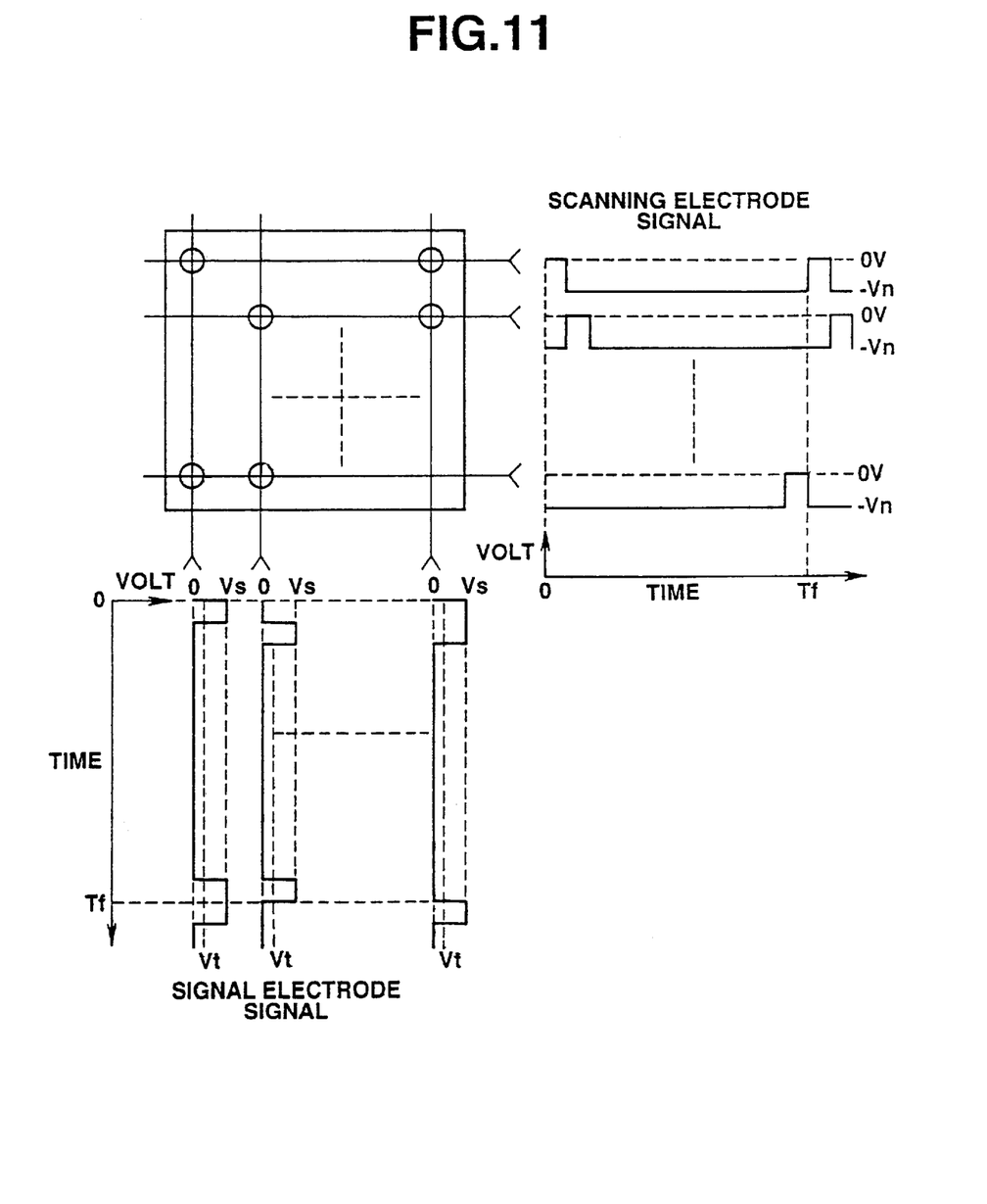
FIG. 11 is a simple drive waveform diagram for an electroluminescent element according to a fifth embodiment of the present invention.

This embodiment illustrates an example wherein a large-capacity display is carried out by connecting simple matrix driving means to the aforementioned electroluminescent element. FIG. 10 shows the composition of this electroluminescent element. As shown in FIG. 10, this display system comprises: the aforementioned electroluminescent element 12, a scanning electrode driver 13, a signal electrode driver 14 and a controller 15. The outputs of the signal electrode driver 14 are connected to the respective anodes 4 constituting the anode group, and the outputs of the scanning electrode driver 13 are each connected individually to the respective cathodes 1 constituting the cathode group. The controller 15 represents means for simple matrix driving of the electroluminescent element 12, and it is constituted such that a scanning electrode signal driven by time division can be supplied to the scanning electrode driver 13 and a signal electrode signal can be supplied to the signal electrode driver 14. The electroluminescent element 12 comprises an anode group of 100 anodes and a cathode group of 320 cathodes, and it is connected as illustrated in FIG. 10. An example of drive waveforms applied to the anodes and cathodes is shown in FIG. 11. In this diagram, Tf indicates scanning time. Here, the system is driven at 1/100 duty. In this drive system, a waveform of sufficient voltage Vs to cause light emission and a pulse width which matches the tonal gradation to be displayed is applied to selected pixels. A voltage Vn below the light emission threshold voltage is applied to pixels which are not selected.

When an image display was carried out using a display system based on an electroluminescent element fabricated according to any one of the first embodiment to the fourth embodiment, it was possible to achieve a clear and vivid colour display.

According to the present embodiment, the electroluminescent element can be driven by time division, thereby enabling an inexpensive high-capacity colour electroluminescent element to be achieved.

INDUSTRIAL APPLICABILITY

According to the present invention, it is possible to provide a full-colour electroluminescent element capable of being driven by simple matrix drive, inexpensively, by means of a simple process. Therefore, the electroluminescent element can be used in colour displays for inexpensive portable terminals, car-mounted displays, and the like.

What is claimed is:

1. An electroluminescent element provided with layers of electroluminescent material interposed between anodes and cathodes, the electroluminescent element comprising:
    an anode group formed by parallel arrangement of a plurality of anodes;
    a bank group formed by parallel arrangement of banks intersecting with said anode group and having a height which prevents outflow of said electroluminescent material introduced during manufacture;
    said electroluminescent material layers formed between said banks; and
    a cathode group, wherein cathodes running in the longitudinal direction of said electroluminescent material layers are provided on said electroluminescent material layers and are separated electrically for each of said electroluminescent material layers by means of said banks, and wherein said cathodes are formed in a continuous fashion over a side face of said banks facing in a prescribed direction, over the top face of said banks in direct contact with said top face, and over said electroluminescent material layers.

2. The electroluminescent element according to claim 1, characterized in that each of the anodes constituting said anode group and each of the cathodes constituting said cathode group are connected individually, further comprising means for providing simple matrix driving of said electroluminescent element.

3. The electroluminescent element according to claim 1, characterized in that the angle formed between at least one side face of said banks and the face on which said banks are installed is an acute angle.

4. The electroluminescent element according to claim 1, characterized in that the angle formed between at least one side face of said banks and top face thereof is an acute angle.

5. The electroluminescent element according to claim 1, wherein said electroluminescent material layers comprise light-emitting layers and charge transporting layers.

6. The electroluminescent element according to claim 1, wherein said electroluminescent material layers comprise light-emitting layers.

7. The electroluminescent element according to claim 6, characterized in that said light-emitting layers emitting light in each of the primary colours for the purpose of providing a colour display are arranged sequentially.

8. A method for manufacturing an electroluminescent element provided with layers of electroluminescent material interposed between anodes and cathodes, the method comprising:

forming an anode group by parallel arrangement of a plurality of anodes on a substrate;

forming a bank group by parallel arrangement of banks intersecting with said anode group and having a height which prevents outflow of said electroluminescent material in an electroluminescent material forming step;

forming electroluminescent material layers by introducing a liquid of said electroluminescent material between said banks; and forming a cathode group wherein cathodes are electrically separated by means of said banks, by depositing cathode material onto said electroluminescent material layers from a direction which forms a prescribed angle with the longitudinal direction of said banks, wherein forming the cathode group includes forming the cathodes continuously over a side face of said banks facing in a prescribed direction, over the top face of said banks in direct contact with said top face, and over said electroluminescent material layers.

9. The method for manufacturing an electroluminescent element according to claim 8, characterized in that said banks are formed such that the angle between the side faces thereof and the face on which said banks are installed is a right angle, and said cathode group is formed by depositing cathode material by oblique vapour deposition from a direction confronting said side faces, or a direction perpendicular to the vertical direction of said banks.

10. The method for manufacturing an electroluminescent element according to claim 8, characterized in that said banks are formed such that the angle between at least one side face of said banks and the face on which said banks are installed is an acute angle, and said cathode group is formed by depositing cathode material by oblique vapour deposition from a direction confronting said one side face or the vertical direction of said banks.

11. The method for manufacturing an electroluminescent element according to claim 8, characterized in that said banks are formed such that the angle between at least one side face of said banks and the top face thereof is an acute angle, and said cathode group is formed by vapour deposition from the vertical direction of said banks.

12. The method for manufacturing an electroluminescent element according to claim 8, characterized in that non-glare treatment is carried out on the surface of said electroluminescent element.

13. The method for manufacturing an electroluminescent element according to claim 8, characterized in that the formation of said electroluminescent material layer is carried out by injecting and filling a liquid of electroluminescent material inbetween said banks by means of an ink-jet method.

14. The method for manufacturing an electroluminescent element according to claim 8, characterized in that non-glare treatment and antireflection treatment are carried out on the surface of said electroluminescent element.

15. A method for manufacturing an electroluminescent element provided with layers of electroluminescent material interposed between anodes and cathodes, the method comprising:

forming an anode group by parallel arrangement of a plurality on a substrate;

forming a bank group by parallel arrangement of banks intersecting with said anode group and having a height which prevents outflow of said electroluminescent material in an electroluminescent material forming step;

forming electroluminescent material layers by using an ink jet to introduce a liquid of said electroluminescent material between said banks; and forming a cathode group wherein cathodes are electrically separated by means of said banks, by depositing cathode material onto said electroluminescent material layers from a direction which forms a prescribed angle with the longitudinal direction of said banks, wherein forming the cathode group includes forming the cathodes continuously over a side face of said banks facing in a prescribed direction, over the top face of said banks in direct contact with said top face, and over said electroluminescent material layers.

* * * * *